US005488228A

United States Patent [19]

Dobler

[11] Patent Number: 5,488,228

[45] Date of Patent: Jan. 30, 1996

[54] SADDLE FIELD SOURCE

[75] Inventor: Hermann Dobler, Aalen, Germany

[73] Assignee: Carl-Zeiss-Stiftung, Heidenheim, Germany

[21] Appl. No.: 321,325

[22] Filed: Oct. 11, 1994

[30] Foreign Application Priority Data

Oct. 8, 1993 [DE] Germany .......................... 43 34 357.0

[51] Int. Cl.$^{6}$ .............................. H01J 37/08; H05H 3/00

[52] U.S. Cl. ..................... 250/423 R; 250/427; 250/251; 315/111.81; 315/111.91; 313/359.1

[58] Field of Search ............................... 250/423 R, 427, 250/251; 315/111.81, 111.91; 313/359.1

[56] References Cited

U.S. PATENT DOCUMENTS

| | | | |
|---|---|---|---|
| 3,944,873 | 3/1976 | Franks et al. | 315/111.8 |
| 4,122,347 | 10/1978 | Kovalsky et al. | 250/423 R |
| 4,354,113 | 10/1982 | Goode et al. | 250/423 R |
| 4,412,153 | 10/1983 | Kalbfus et al. | 315/111.81 |
| 4,608,513 | 8/1986 | Thompson | 313/359.1 |

FOREIGN PATENT DOCUMENTS

| | | |
|---|---|---|
| 2124824 | 2/1984 | United Kingdom . |
| 2144577 | 3/1985 | United Kingdom . |

OTHER PUBLICATIONS

Flemming, *J. Vac. Sci. Technol.*, vol. 12, No. 6, Nov./Dec. 1975, pp. 1369–1372.

"Atom beam source" by J. Franks, Vacuum, vol. 34, Nos. 1-2, 1984 pp. 259 to 261.

"Ion sources for ion beam assisted thin–film deposition" by W. Ensinger, Rev. Sci. Instrum. 63 (11), Nov. 1992, American Institute of Physics, pp. 5217 to 5233.

*Primary Examiner*—Jack I. Berman

*Attorney, Agent, or Firm*—Walter Ottesen

[57] ABSTRACT

The invention is directed to a saddle field source for ions or neutral particles which is asymmetrically configured. The saddle field source preferably has three electrodes and has an improved efficiency.

16 Claims, 3 Drawing Sheets

SADDLE FIELD SOURCE

FIELD OF THE INVENTION

The invention relates to a saddle field source having a chamber which, in turn, has an exit opening and contains electrodes so that an electric field having a saddle is produced in the chamber and a particle beam exits from the exit opening in a preferred direction.

BACKGROUND OF THE INVENTION

A saddle field source of the kind referred to above is suitable for generating an ion beam as well as a neutral particle beam by means of an internal charge exchange. Such a saddle field source is disclosed in the article of J. Franks entitled "Atom beam source" published in the journal "Vacuum", Volume 34, Numbers 1–2, (1984), pages 259 to 261. The above-mentioned saddle field source as strictly an ion source is also disclosed in U.S. Pat. Nos. 3,944,873 and 4,354,113 and in the article of W. Ensinger entitled "Ion sources for ion beam assisted thin-film deposition" published in "Review of Scientific Instruments", Volume 63, Number 11, (November 1992), pages 5217 to 5233 (FIGS. 16 and 17).

Conventionally, saddle field sources have a high symmetry and especially a mirror plane which contains the anode arrangement and a mirror plane perpendicular thereto which contains the exit opening. The chamber defining the cathode and the anode arrangement are substantially mirror-symmetrical to both planes. In this way, the electric field defines a saddle point in the chamber within the anode arrangement. The symmetry produces the condition that the ion particle current or neutral particle current exiting via the exit opening corresponds to a current of the same magnitude on the opposite-lying wall surface.

This return current is lost and possibly produces damage to the wall of the chamber so that the efficiency of the ion or particle source is reduced. U.S. Pat. No. 3,944,873 suggests in FIG. 6 to utilize a hole in the rear wall for monitoring purposes.

The cited patents disclose arrangements which increase the symmetry of the saddle field sources, especially with respect to the electric field, by means of additional shielding electrodes.

Saddle field sources are described having spherical or cylindrical chambers with axial exit openings for conically-shaped ion or particle beams. Saddle field sources having cylindrical chambers and an exit slit on the circular cylindrical wall for a wide curtain-like ion beam are also described.

SUMMARY OF THE INVENTION

It is an object of the invention to provide a saddle field source having an increased efficiency and a good direction characteristic.

The saddle field source of the invention includes: a chamber having an exit opening defining a preferred direction and the chamber defining a center plane perpendicular to the preferred direction; a plurality of electrodes mounted in the chamber to produce an electric field defining a saddle when voltage is applied to the electrodes; gas supply means for supplying a gas to the chamber which is ionized to produce particles of which a portion passes from the chamber through the exit opening in the direction as a particle beam when the voltage is applied; and, the electrodes being disposed in the chamber so as to define an arrangement of the electrodes which is asymmetrical with respect to the center plane and the electric field likewise being asymmetrical with respect to the center plane.

The mirror symmetry to the plane containing the electrodes of the known saddle field sources is dispensed with geometrically as well as with respect to the electric field. This mirror symmetry is given up further than only by the disturbance produced necessarily by the exit opening.

With this departure from the principle maintained up to now, the particle current flowing opposite to the preferred direction in the source is considerably reduced and the portion of the particles passing through the exit opening is increased.

This applies to the generation of ions as well as to the generation of energetic neutral particles by means of a charge exchange in the chamber.

According to another feature of the invention, an ancillary anode is added to the anode arrangement known per se for saddle field sources. This ancillary anode is mounted rearward of the anode arrangement as viewed from the exit opening. The anode arrangement can, as known, comprise two rod-shaped parts or the anode arrangement can be an annularly-shaped part depending upon the shape of the chamber.

The ancillary anode disturbs, in principle, the electrons circulating in the saddle field source, reduces their free path length and therefore the probability of ionization. This effect can, however, be greatly suppressed by a suitable selection of the dimensions and can be overcompensated by the improved direction characteristic of the ion movement. Preferably, the ancillary anode is mounted in the region of the symmetry axis so that the direction characteristic can be favorably affected.

The ancillary anode is preferably brought to the same potential as the anode arrangement. The advantages provided by the invention are achieved without any change of the voltage supply and especially without any additional high voltage.

The ancillary electrode can be made of several parts or several ancillary electrodes can be provided.

Preferably, the asymmetry according to the invention is further increased in that the anode arrangement is shifted away from the exit opening and out of the symmetry plane of the chamber. This provides for a further improvement of the direction characteristic.

The saddle field source of the invention is suitable for generating a particle beam curtain in the manner of the known longitudinally extending embodiments. For this purpose, the symmetry axis is expanded to a symmetry plane and the exit opening is longitudinally extended to define a slit along the intersect line of a chamber wall and the symmetry plane. The exit opening can also be a plurality of holes along this intersect line. The embodiment of the hole row provides improved throttling of the gas loss from the chamber and the uniform divergence of the particle beam in all directions.

It can be especially simple to provide the chamber with a hollow space corresponding to a parallelepiped especially for the elongated source whereby the chamber can be assembled from simple plates.

Projections of the chamber walls in the regions adjacent the anode arrangement and the ancillary electrode are useful aids for the formation of the electric field.

The preferred material for the active surfaces of the electrodes and the chamber is carbon such as pyrolytic graphite, electrographite or glass-like carbon. This last-mentioned material is especially advantageous for rod-shaped electrodes because of its stability. The material can be used for the entire structure except for the necessary insulators.

The electric field in the chamber with the electrodes is preferably so configured that it impresses on the generated ions a preferred direction toward the exit opening. This is applicable also for energy-rich neutral particles generated by the charge exchange.

According to another feature of the invention, the electric field in the chamber has a saddle in the region between the elements of the anode arrangement and a second saddle closer to the ancillary anode. The second saddle, which is introduced in contrast to the known state of the art, is so configured that the probability density for the electrons and therefore the probability of ionization in this region is increased. In contrast to conventional saddle field sources, the effectiveness of the source is increased by the second saddle because the ions generated in this region are accelerated toward the exit opening.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
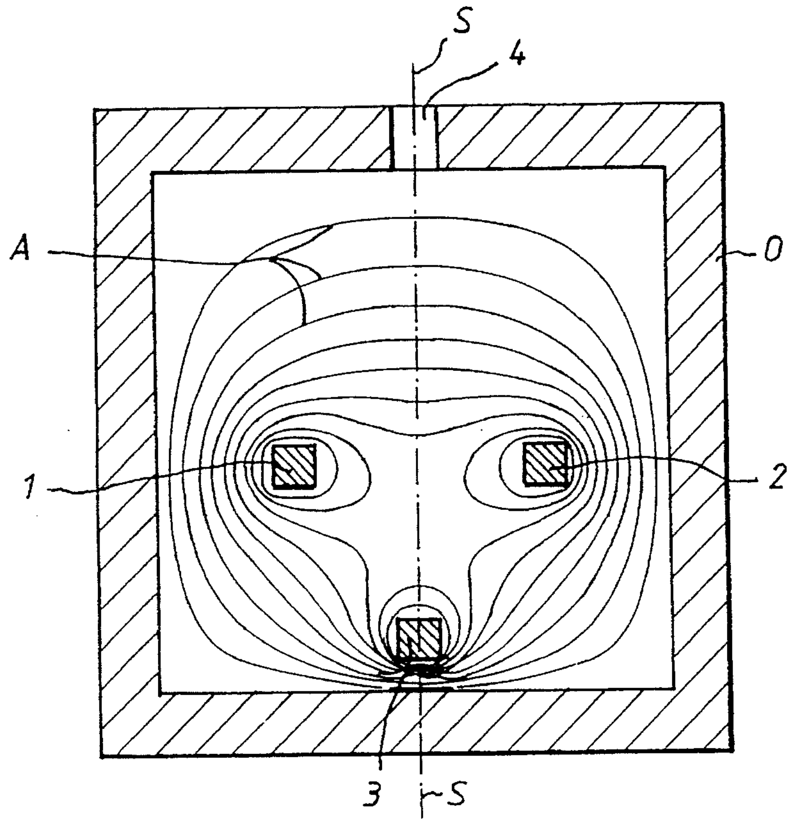
FIG. 1 is a schematic of a saddle field source according to an embodiment of the invention having equipotential lines of the electric field.

FIG. 1 is a section view taken through a saddle field source having a chamber 0, electrodes (1, 2, 3} and an exit opening 4. The entire chamber is mirror symmetric to the symmetry axis S. The exit opening 4 lies on the symmetry axis S and the anode arrangement comprising electrodes (1, 2) is off-center and arranged in mirror image. The ancillary electrode 3 is arranged on the side of the chamber 0 facing away from the exit opening 4 and is on the symmetry axis S.

To generate a rotationally-symmetrical beam, the arrangement is preferably also rotationally symmetrical to the symmetry axis S. The chamber 0 is then a hollow circular cylinder and the anode arrangement (1, 2) is annular, that is, the electrodes (1, 2) extend one into the other.

A saddle field source for a curtain-shaped particle beam can, however, have the same cross section wherein the particle beam expands in the direction perpendicular to the cross section. The symmetry axis S is then expanded to a mirror plane perpendicular to the cross section. The chamber 0 has the shape of a parallelepiped and the exit opening 4 is configured as a slit or as a series of small holes.

The three electrodes (1, 2, 3) are connected in common to a positive high voltage (+2 kV) and the chamber 0 is grounded. In this way, each two mutually adjacent equipotential lines in FIG. 1 are at a spacing of 200 Volts.

In a conventional saddle field source, the ancillary electrode 3 is not provided and the anode arrangement (1, 2) lies in the center between the wall having the exit opening 4 and the lower wall of the chamber 0. The electric field and the potential distribution are therefore symmetrical to the center plane in which the anode arrangement (1, 2) lies, except for the slight disturbance in the region of the exit opening 4 which is caused by the missing conducting wall.

All ions which originate below the center plane are therefore per force accelerated downwardly away from the exit opening 4. The ions generated on the center plane see only a potential drop within this plane and can therefore not leave this plane. Half of all ions generated by the electron pulse are therefore, ab initio, lost for the particle beam emanating from the exit opening 4.

In the embodiment of FIG. 1, the above-described symmetry is reduced and a larger region of the source rearward of the middle plane shows a potential gradient in the direction of the exit opening 4. A continuous potential gradient is provided especially on the symmetry axis S from the ancillary electrode 3 up to the exit opening 4 so that all particles generated in this region are accelerated toward the exit opening. This applies also for a large portion of the space between the ancillary electrode 3 and the anode arrangement (1, 2). The increase of the potential to the electrodes (1, 2) even provides a focusing action toward the exit opening 4.

The arrangement of FIG. 1 has a saddle point approximately at the midpoint between the three electrodes (1, 2, 3). With displacements of the electrodes (1, 2, 3), even two saddle points are possible on the symmetry axis S one of which is between the electrodes (1, 2) of the anode arrangement and the other closer to the ancillary anode 3.

Figure 2:
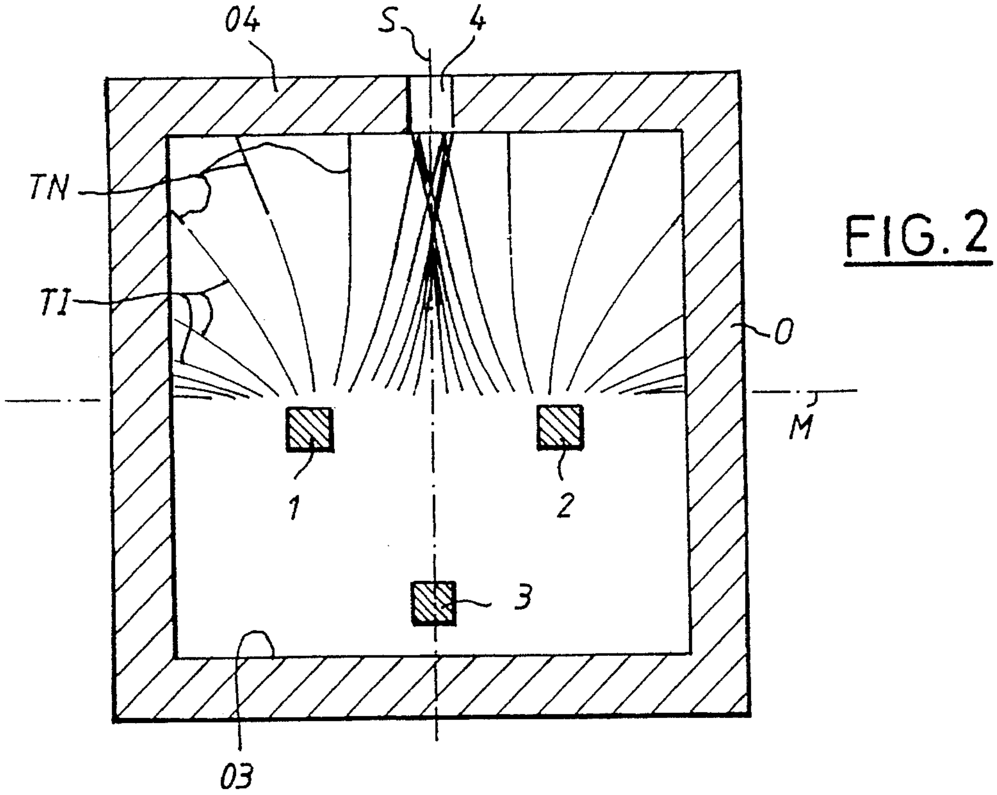
FIG. 2 is the saddle field source of FIG. 1 showing trajectories of generated ions or neutral particles.

FIG. 2 shows the result of a numerical simulation computation according to which all ions generated on the center line M of the chamber 0 by the electron pulse migrate into the upper half of the chamber in the arrangement of FIG. 1. The ions remain in this plane in the conventional arrangement. Furthermore, the electric field has a focusing action so that the greater part of the ions generated between the electrodes (1 and 2) also reaches the exit opening 4.

The arrangement according to the invention is therefore suitable for bringing a considerably increased portion of the ions, which are generated by the electron pulse in the saddle field source, to the exit opening 4.

FIG. 2 shows the particle paths which are distinguished by trajectories TI of the ions (thin lines) and the trajectories TN extending therefrom (thick lines) of the neutral particles generated by charge exchange. The trajectory paths TN of the neutral particles all run straight because there is no interaction with the electric field.

For the charge exchange, that is, for the transition from ion to energized neutral particle, it is proceeded from the mean free path length for argon with a pressure in the chamber 0 of 1 Pa and the different energy of the ions on various trajectories TI being considered.

The potential trace in the proximity of the exit opening 4 has accordingly no significant meaning for the operation of a neutral particle source because the charge exchange already takes place at a larger spacing at least for most of the generated ions.

Figure 3A:
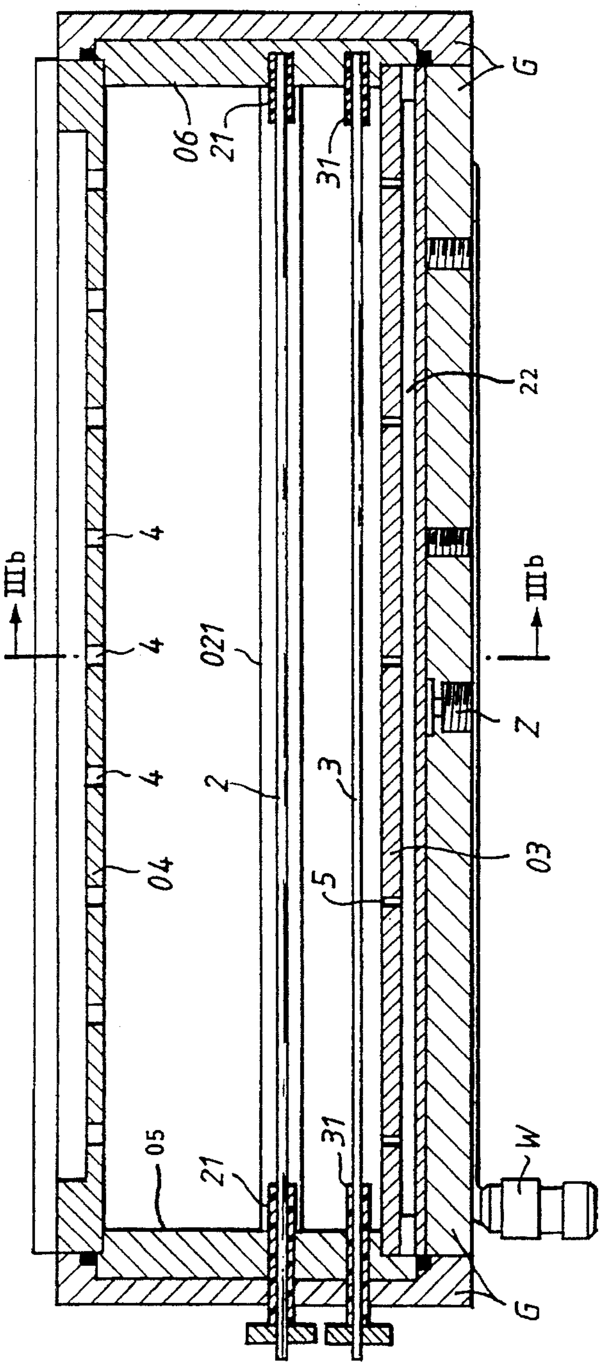
FIG. 3*a* is a longitudinal section view taken through the embodiments of the saddle field source shown in FIGS. 1 and 2.
Figure 3B:
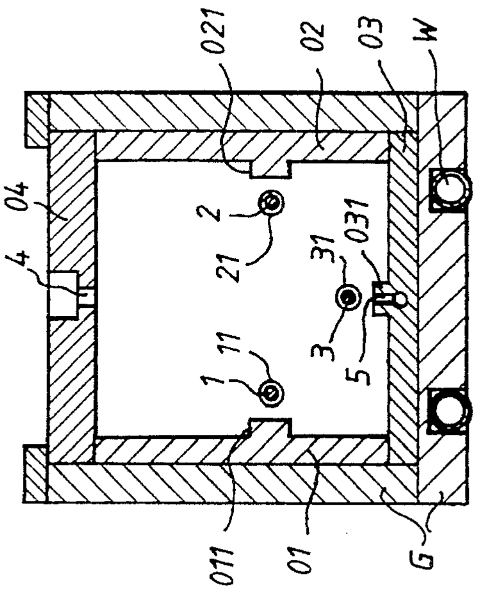
FIG. 3*b* is a section view taken along line IIIb—IIIb of the saddle field source shown in FIG. 3*a;*

An embodiment is shown in FIGS. 3*a* and 3*b* having nine exit openings 4 in a row with each two mutually adjacent ones of the openings having a spacing of 2.5 cm therebetween. The chamber 0 of this embodiment has internal dimensions of 24 cm in length, 6 cm in width and 6 cm in height. In this way, a wide curtain-like component beam is generated which impinges on a target in the form of an elongated rectangle.

The chamber 0 comprises 6 graphite plates (01, 02, 03, 04, 05, 06) which are fastened form-tight in a metal housing G having a device W for water cooling and a connection Z for the gas feed which is provided via a distribution channel 22 and bores 5 in the plate 03. Rods made of glass carbon are provided as electrodes (1, 2, 3) and have a diameter of 2 mm. The rods are attached with insulating sleeves (11, 21, 31) in an end plate 06 and are passed so as to be longitudinally displaceable through the other end plate 05 for heat expansion. The rods are clamped to the electrical connecting leads with terminals.

The plates (01, 02, 03) have projections (011, 021, 031) next to the respective electrodes (1, 2, 3) with which the course of the electric field in the region of the electrodes (1, 2, 3) can be affected. Electrons are thereby held away from the electrodes (1, 2, 3) and are made available in increased quantity for ionization. In addition, corona discharges between the electrodes (1, 2, 3) and the plates (01, 02, 03) are suppressed by these measures.

The length of such a saddle field source can be varied in dependence upon the requirement in a vacuum treatment apparatus. The length can easily be ten times the cross-sectional dimension.

Figure 4A:
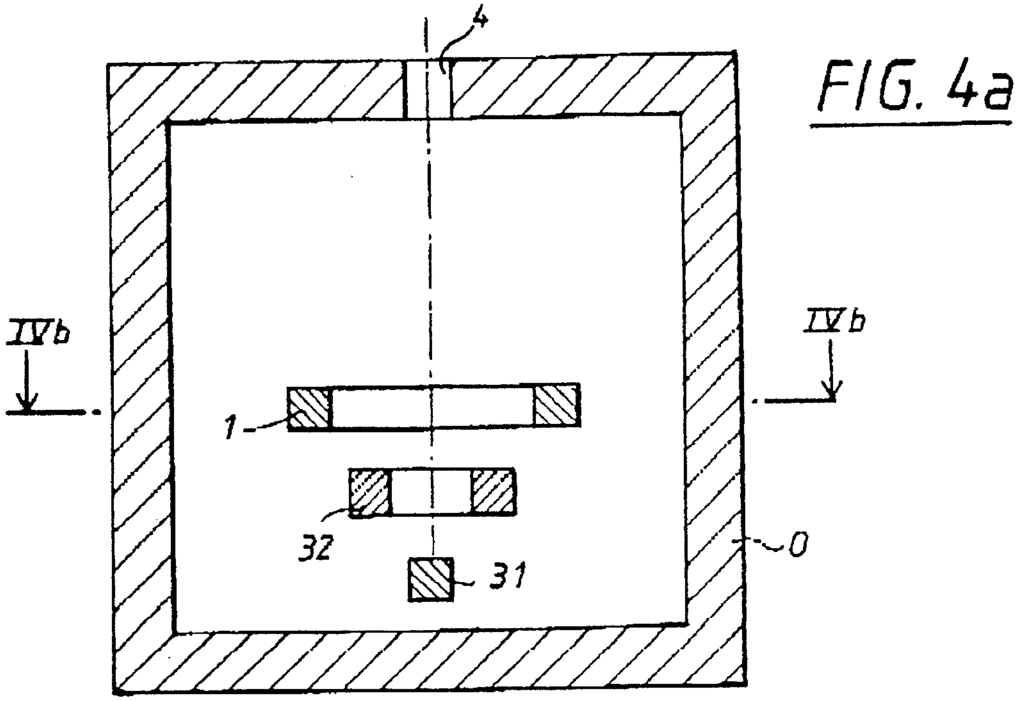
FIG. 4*a* is a schematic of a saddle field source with an annular anode and two ancillary electrodes; and, FIG. 4*b* is a section view taken along line IVb—IVb of the saddle field source shown in FIG. 4*a*.
Figure 4B:
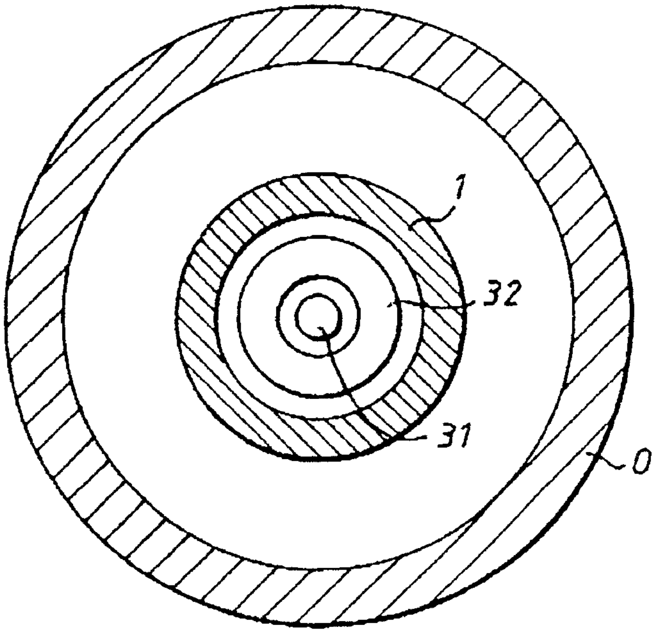

The embodiment of FIGS. 4*a* and 4*b* includes a cylindrical chamber 0 with one axial exit opening 4, an annular anode arrangement 1 and an ancillary electrode composed of two parts, namely, a small cylindrical electrode 31 on the symmetry axis and an annular additional electrode 32 inserted between electrode 31 and annular anode arrangement 1.

The cylindrical symmetric geometry of all parts is adapted to a symmetric ion beam to be emitted from the exit opening 4.

The splitting of the ancillary electrode into two parts (31, 32) allows for a more detailed influence on the potential distribution inside chamber 0.

A particle source pursuant to the principle of the saddle field source is suggested wherein the electrode arrangement (1, 2, 3) is asymmetrical in the direction of the particle beam. The asymmetry is primarily obtained in that at least one further electrode is mounted on the side opposite the particle beam.

The proposed saddle field source affords all advantages of the saddle field source pursuant to the state of the art; that is:

(a) the saddle field source can be operated with direct voltage and the same high voltage can be applied to all electrodes;

(b) the saddle field source can be made entirely of graphite and is then substantially resistant to oxygen;

(c) the saddle field source has no parts which are subject to wear;

(d) the saddle field source can be operated as an ion source or as a neutral particle source by varying the operating parameters;

(e) the saddle field source can supply a thinly concentrated particle beam or a wide fan-like particle beam by means of its assembly and operating data;

(f) the saddle field source can produce either energy-rich particles (approximately 500 eV) or particles having a low energy level (approximately 10 eV) by selecting appropriate operating conditions (pressure in the chamber and high voltage).

The primary advantage of the saddle field source according to the invention is, however, that it operates significantly more efficiently than the saddle field sources known to date. The number of emitted fast particles can be increased approximately by the factor of 1.7.

The source according to the invention is applicable, for example, with neutral particles in the high energy range up to approximately 500 eV for cleaning substrates or for sputter etching as a substitute for corona discharge processes. Cleaning is more effective because of reduced pressure in the target chamber and the contamination between the cleaning and subsequent coating is reduced.

For example, the structure of growing thin films can be influenced with lower energy neutral particles having an electron energy of several ten electron volt.

Oxygen, for example, can be emitted from the source onto metal oxide coatings whereby the films become thicker, the refractive index increases and the absorption is reduced in comparison to supplying thermal oxygen. Layers of high quality can be produced on temperature-sensitive bases because, with this method, only the growing layer is warmed.

It is understood that the foregoing description is that of the preferred embodiments of the invention and that various changes and modifications may be made thereto without departing from the spirit and scope of the invention as defined in the appended claims.

What is claimed is:

1. An electrostatic saddle field source comprising:

a chamber having an exit opening defining a preferred direction and said chamber defining a center plane perpendicular to said preferred direction;

a plurality of electrodes mounted in said chamber to produce an electric field defining a saddle when voltage is applied to said electrodes;

gas supply means for supplying a gas to said chamber which is ionized to produce particles of which a portion passes from said chamber through said exit opening in said direction as a particle beam when said voltage is applied; and, said electrodes being disposed in said chamber so as to define an arrangement of said electrodes which is asymmetrical with respect to said center plane and said electric field likewise being asymmetrical with respect to said center plane.

2. The saddle field source of claim 1, said particle beam consisting of ions or energetic neutral particles.

3. The saddle field source of claim 1, said chamber including a wall structure defining essentially a parallelepiped.

4. The saddle field source of claim 1, said chamber and said electrodes having respective active surfaces and comprising a material on said active surfaces selected from the group consisting of carbon, electrographite and glass-like coal.

5. The saddle field source of claim 1, wherein said electric field causes said ions to move in said preferred direction toward said exit opening.

6. A saddle field source comprising:

a chamber having an exit opening defining a preferred direction and said chamber defining a center plane perpendicular to said preferred direction;

a plurality of electrodes mounted in said chamber to produce an electric field defining a saddle when voltage is applied to said electrodes;

gas supply means for supplying a gas to said chamber which is ionized to produce particles of which a portion passes from said chamber through said exit opening in said direction as a particle beam when said voltage is applied;

said electrodes being disposed in said chamber so as to define an arrangement of said electrodes which is asymmetrical with respect to said center plane and said electric field likewise being asymmetrical with respect to said center plane;

said electrodes defining an anode arrangement and an ancillary electrode;

said chamber being configured as a cathode for coacting with said anode arrangement and said chamber further defining a symmetry axis perpendicular to said center plane;

said exit opening being on said symmetry axis;

said anode arrangement being disposed symmetrically to said symmetry axis so as to leave a clear region near said axis; and, said ancillary electrode being disposed rearward of said anode arrangement when viewed from said exit opening.

7. The saddle field source of claim 6, said anode arrangement being defined by two rod-shaped parts.

8. The saddle field source of claim 6, said anode arrangement being a ring-shaped part.

9. The saddle field source of claim 6, said ancillary electrode being disposed on said symmetry axis.

10. The saddle field source of claim 6, wherein the same voltage is applied to all of said electrodes.

11. The saddle field source of claim 6, said ancillary electrode having a plurality of parts.

12. The saddle field source of claim 6, said chamber having a first side wall and said exit opening being formed in said first side wall; said chamber also having a second side wall lying directly opposite said first side wall and on said symmetry axis; said first side wall and said anode arrangement defining a first spacing therebetween and said second side wall and said anode arrangement defining a second spacing therebetween less than said first spacing.

13. The saddle field source of claim 12, said axis being included in a symmetry plane which intersects said first side wall to define an intersect line; and, said exit opening extending along said intersect line as a slit.

14. The saddle field source of claim 12, said axis being included in a symmetry plane which intersects said first side wall to define an intersect line; and, said saddle field source comprising a plurality of said exit openings disposed along said intersect line.

15. The saddle field source of claim 6, wherein said electric field defines said saddle in said clear region near said axis and said electric field defines a second saddle near said ancillary electrode.

16. A saddle field source comprising:

a chamber having an exit opening defining a preferred direction and said chamber defining a center plane perpendicular to said preferred direction;

a plurality of electrodes mounted in said chamber to produce an electric field defining a saddle when voltage is applied to said electrodes;

gas supply means for supplying aas to said chamber which is ionized to produce particles of which a portion passes from said chamber through said exit opening in said direction as a particle beam when said voltage is applied;

said electrodes being disposed in said chamber so as to define an arrangement of said electrodes which is asymmetrical with respect to said center plane and said electric field likewise being asymmetrical with respect to said center plane; and, said chamber having side walls with raised portions adjacent to said electrodes.

* * * * *

UNITED STATES PATENT AND TRADEMARK OFFICE
CERTIFICATE OF CORRECTION

PATENT NO. : 5,488,228

DATED : January 30, 1996

INVENTOR(S) : Hermann Dobler

It is certified that error appears in the above-identified patent and that said Letters Patent is hereby corrected as shown below:

In column 1, line 38: delete "wail" and substitute -- wall -- therefor.

In column 8, line 25: delete "aas" and substitute -- a gas -- therefor.

Signed and Sealed this

Twenty-eighth Day of May, 1996

*Attest:*

BRUCE LEHMAN

*Attesting Officer*

*Commissioner of Patents and Trademarks*